United States Patent
Lee et al.

(10) Patent No.: US 12,140,638 B2
(45) Date of Patent: Nov. 12, 2024

(54) METHOD FOR MEASURING CELL PERFORMANCE

(71) Applicant: LG ENERGY SOLUTION, LTD., Seoul (KR)

(72) Inventors: Woo Sirl Lee, Daejeon (KR); Do Hwa Jung, Daejeon (KR); Ki Woong Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 777 days.

(21) Appl. No.: 17/296,368

(22) PCT Filed: Nov. 25, 2019

(86) PCT No.: PCT/KR2019/016273
§ 371 (c)(1),
(2) Date: May 24, 2021

(87) PCT Pub. No.: WO2020/111695
PCT Pub. Date: Jun. 4, 2020

(65) Prior Publication Data
US 2021/0396810 A1    Dec. 23, 2021

(30) Foreign Application Priority Data
Nov. 29, 2018 (KR) .................. 10-2018-0151257

(51) Int. Cl.
*G01R 31/36* (2020.01)
*H01M 10/04* (2006.01)
*H01M 50/531* (2021.01)

(52) U.S. Cl.
CPC ........ *G01R 31/36* (2013.01); *H01M 10/0436* (2013.01); *H01M 50/531* (2021.01)

(58) Field of Classification Search
None
See application file for complete search history.

(56) References Cited

U.S. PATENT DOCUMENTS

| | | | |
|---|---|---|---|
| 9,847,558 | B1 | 12/2017 | Wang et al. |
| 2003/0013012 | A1 | 1/2003 | Ahn et al. |

(Continued)

FOREIGN PATENT DOCUMENTS

| | | |
|---|---|---|
| CN | 104181436 A | 12/2014 |
| CN | 105261781 A | 1/2016 |

(Continued)

OTHER PUBLICATIONS

International Search Report for PCT/KR2019/016273 mailed on Mar. 9, 2020.

(Continued)

*Primary Examiner* — Alix E Eggerding
(74) *Attorney, Agent, or Firm* — Birch, Stewart, Kolasch & Birch, LLP

(57) ABSTRACT

Disclosed is a method for measuring cell performance. The method for manufacturing performance of a unit cell, in which a first electrode provided with a first electrode tab, a separator, and a second electrode provided with a second electrode tab are alternately laminated to be bonded to each other, comprises an additional lamination step of further laminating counter electrodes, each of which has the same polarity as that of the second electrode and is provided with a third electrode tab, on sides facing the first electrode at the outermost sides of the unit cell with the separator therebetween, and an outer interface analysis step of measuring a different in performance between the first electrode and each of the counter electrodes by electrically connecting the first electrode tab disposed on the first electrode to the third electrode tab disposed on the counter electrode.

12 Claims, 15 Drawing Sheets

(56) References Cited

U.S. PATENT DOCUMENTS

| | | |
|---|---|---|
| 2003/0148179 A1 | 8/2003 | Uyama et al. |
| 2010/0248040 A1 | 9/2010 | Saito et al. |
| 2013/0323542 A1 | 12/2013 | Wijayawardhana et al. |
| 2014/0287287 A1 | 9/2014 | Osaka et al. |
| 2014/0363714 A1 | 12/2014 | Lim et al. |
| 2016/0308260 A1* | 10/2016 | Yu .................... H01M 4/5825 |
| 2017/0222280 A1 | 8/2017 | Asano et al. |
| 2019/0064275 A1* | 2/2019 | Han .................... H01M 50/569 |
| 2019/0094309 A1* | 3/2019 | Cho .................... G01R 31/36 |
| 2019/0190092 A1 | 6/2019 | Kim et al. |
| 2021/0135322 A1* | 5/2021 | Chu .................... H01M 4/1395 |

FOREIGN PATENT DOCUMENTS

| | | |
|---|---|---|
| CN | 106058302 A | 10/2016 |
| CN | 106707185 A | 5/2017 |
| CN | 107949933 A | 4/2018 |
| CN | 101071886 A | 7/2024 |
| CN | 106575795 A | 7/2024 |
| CN | 107026282 A | 7/2024 |
| EP | 1 294 031 A1 | 3/2003 |
| EP | 1 981 102 A1 | 10/2008 |
| JP | 2000-285909 A | 10/2000 |
| JP | 2012-79582 A | 4/2012 |
| JP | 2014-207174 A | 10/2014 |
| JP | 5850492 B2 | 2/2016 |
| KR | 1999-015271 A | 3/1999 |
| KR | 10-0477719 B1 | 5/2005 |
| KR | 10-0515571 B1 | 9/2005 |
| KR | 10-2014-0015647 A | 2/2014 |
| KR | 10-1451193 B1 | 10/2014 |
| KR | 10-2015-0041840 A | 4/2015 |
| KR | 10-2015-0092854 A | 8/2015 |
| KR | 10-1636115 B1 | 7/2016 |
| KR | 10-1804512 B1 | 1/2018 |
| KR | 10-2018-0079924 A | 7/2018 |
| WO | WO 2013/054813 A1 | 4/2013 |

OTHER PUBLICATIONS

Extended European Search Report for European Application No. 19889603.7, dated Nov. 15, 2021.

\* cited by examiner

Prior Art FIG. 2

METHOD FOR MEASURING CELL PERFORMANCE

CROSS-REFERENCE TO RELATED APPLICATION

The present application claims the benefit of the priority of Korean Patent Application No. 10-2018-0151257, filed on Nov. 29, 2018, which is hereby incorporated by reference in its entirety.

TECHNICAL FIELD

The present invention relates to a method for measuring cell performance.

BACKGROUND ART

Secondary batteries are rechargeable unlike primarily batteries, and also, the possibility of compact size and high capacity is high. Thus, recently, many studies on secondary batteries are being carried out. As technology development and demands for mobile devices increase, the demands for secondary batteries as energy sources are rapidly increasing.

Rechargeable batteries are classified into coin type batteries, cylindrical type batteries, prismatic type batteries, and pouch type batteries according to a shape of a battery case. In such a secondary battery, an electrode assembly mounted in a battery case is a chargeable and dischargeable power generating device having a structure in which an electrode and a separator are stacked.

The electrode assembly may be approximately classified into a jelly-roll type electrode assembly in which a separator is interposed between a positive electrode and a negative electrode, each of which is provided as the form of a sheet coated with an active material, and then, the positive electrode, the separator, and the negative electrode are wound, a stacked type electrode assembly in which a plurality of positive and negative electrodes with a separator therebetween are sequentially stacked, and a stack/folding type electrode assembly in which stacked type unit cells are wound together with a separation film having a long length.

Recently, the pouch-type battery in which a stack/folding type electrode assembly is built in a pouch-type battery case provided as an aluminum lamination sheet is attracting much attention due to its low manufacturing cost, small weight, easy shape deformation, and the like, and thus, its usage is gradually increasing.

FIG. 1 is a plan view illustrating a state before a stack & folding cell is folded according to the related art, and FIG. 2 is a perspective view illustrating the state after a stack & folding cell is folded according to the related art.

Referring to FIGS. 1 and 2, in a stack/folding type electrode assembly 10, a plurality of unit cells 12 are stacked on a separation film 11 so as to be spaced a predetermined distance from each other and then sequentially filed in one direction to form the electrode assembly 10.

However, it is difficult to analyze cell performance with respect to the unit cells 12 of the stack/folding electrode assembly 10.

PRIOR ART DOCUMENTS

Patent Documents

Korean Patent Publication No. 10-2014-0015647

DISCLOSURE OF THE INVENTION

Technical Problem

One aspect of the present invention is to provide a method for measuring cell performance, which is capable of analyzing the performance of unit cells of a stack/folding type electrode assembly.

Technical Solution

A method for manufacturing performance of a unit cell, in which a first electrode provided with a first electrode tab, a separator, and a second electrode provided with a second electrode tab are alternately laminated to be bonded to each other, according to an embodiment of the present invention comprises: an additional lamination step of further laminating counter electrodes, each of which has the same polarity as that of the second electrode and is provided with a third electrode tab, on sides facing the first electrode at the outermost sides of the unit cell with the separator therebetween; and an outer interface analysis step of measuring a different in performance between the first electrode and each of the counter electrodes by electrically connecting the first electrode tab disposed on the first electrode to the third electrode tab disposed on the counter electrode.

Advantageous Effects

According to the present invention, the counter electrodes may be further provided on the outer surface of the unit cell to measure a difference in performance between the interfaces, thereby analyzing the performance of the unit cell.

MODE FOR CARRYING OUT THE INVENTION

Figure 1:
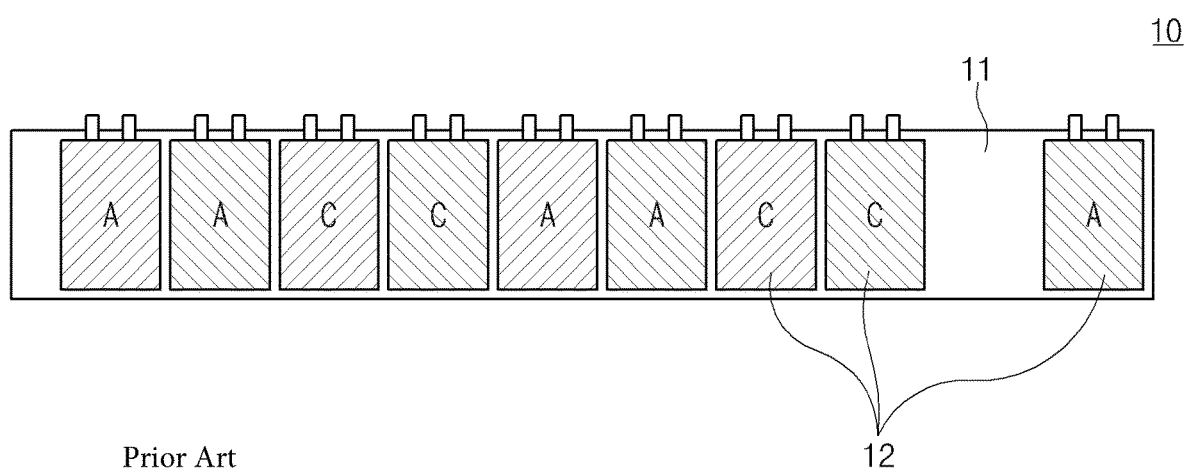
FIG. 1 is a plan view illustrating a state before a stack & folding cell is folded according to the related art.
Figure 2:
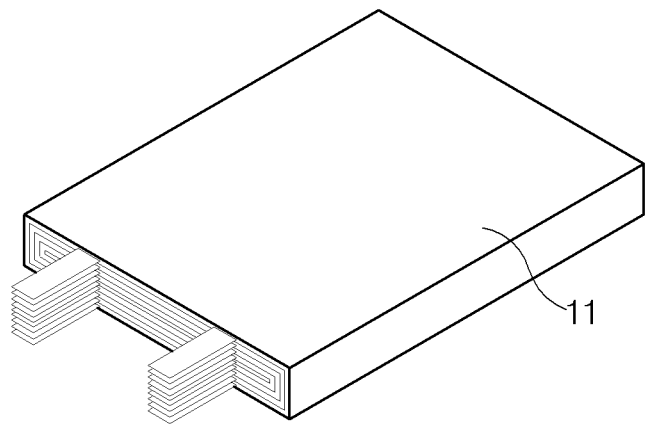
FIG. 2 is a perspective view illustrating the state after a stack & folding cell is folded according to the related art.

The objectives, specific advantages, and novel features of the present invention will become more apparent from the following detailed description taken in conjunction with the accompanying drawings. It should be noted that the reference numerals are added to the components of the drawings in the present specification with the same numerals as possible, even if they are illustrated in other drawings. Also, the present invention may be embodied in different forms and should not be construed as limited to the embodiments set forth herein. In the following description of the present invention, the detailed descriptions of related arts which may unnecessarily obscure the gist of the present invention will be omitted.

Figure 3:
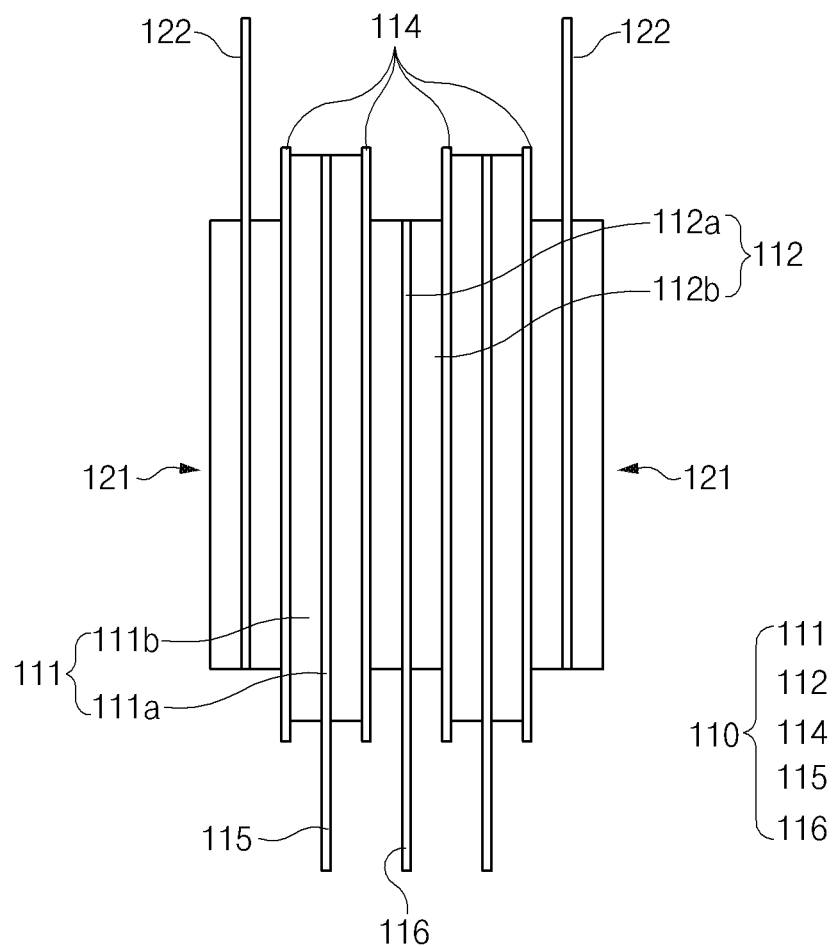
FIG. 3 is a cross-sectional view illustrating a first unit cell applied to a method for manufacturing cell performance according to an embodiment of the present invention.
Figure 4:
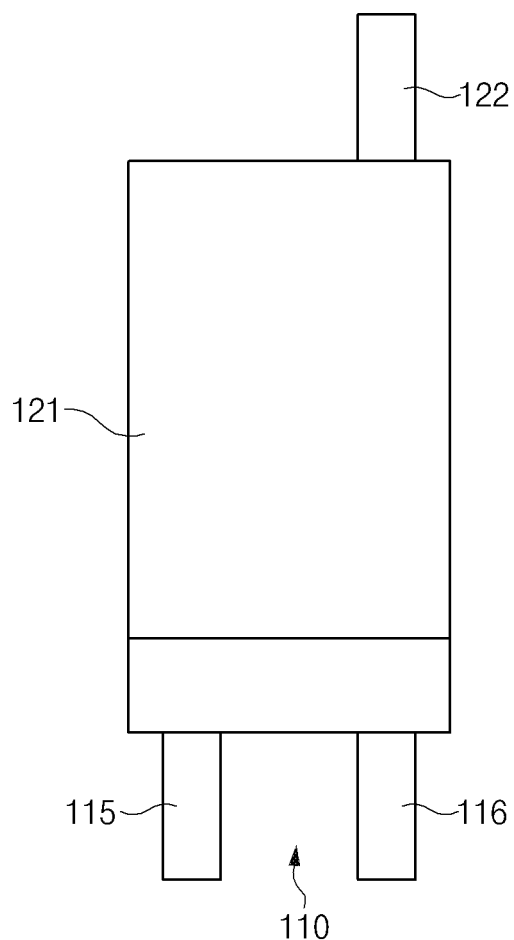
FIG. 4 is a plan view illustrating the first unit cell applied to the method for manufacturing the cell performance according to an embodiment of the present invention.

FIG. 3 is a cross-sectional view illustrating a first unit cell applied to a method for manufacturing cell performance according to an embodiment of the present invention, and FIG. 4 is a plan view illustrating the first unit cell applied to the method for manufacturing the cell performance according to an embodiment of the present invention.

Referring to FIGS. 3 and 4, a method for manufacturing cell performance according to an embodiment of the present invention is a method for measuring performance of a unit cell 110 and comprises an additional lamination step of further laminating a counter electrode 121 on the outermost side of the unit cell 110, in which a first electrode 111, a separator 114, and a second electrode 112 are alternately laminated to be bonded to each other, and an outer interface analysis step of measuring a difference in performance between interfaces of the first electrode 111 and the counter electrode 121.

Also, the method for manufacturing the cell performance according to an embodiment of the present invention may further comprise an inner interface analysis step of measuring a difference in performance between interfaces of the first electrode 111 and the second electrode 112.

Figure 5:
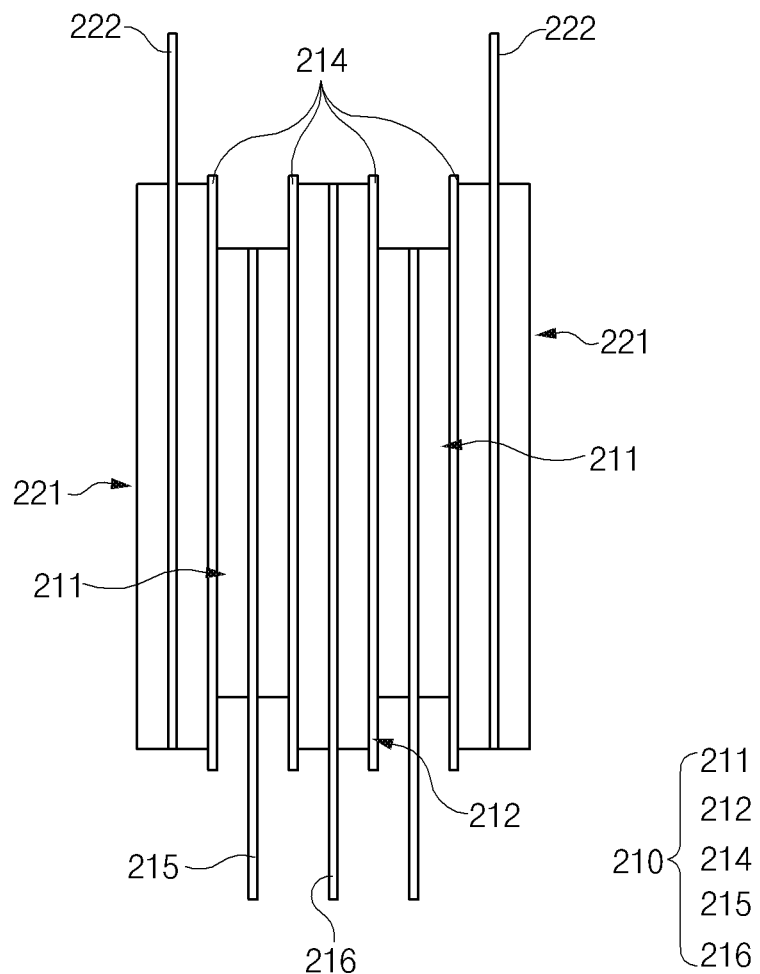
FIG. 5 is a cross-sectional view illustrating a second unit cell applied to the method for manufacturing the cell performance according to an embodiment of the present invention.
Figure 6:
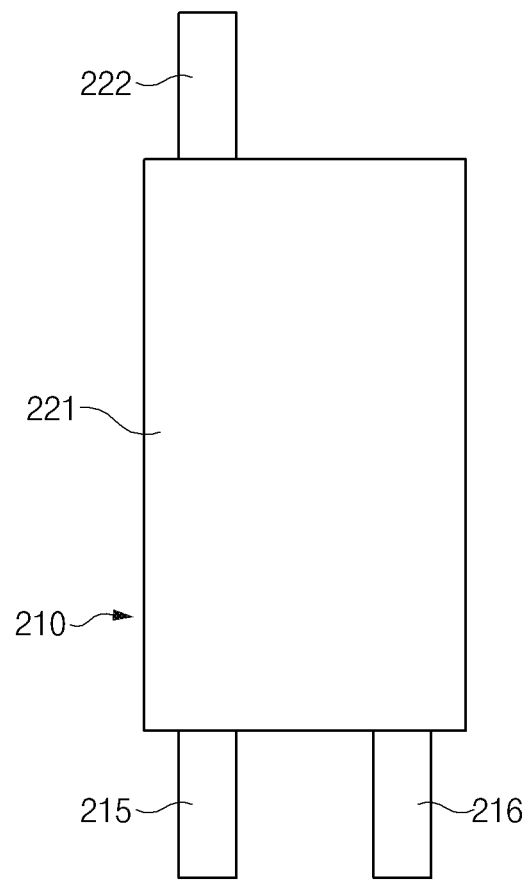
FIG. 6 is a plan view illustrating the second unit cell applied to the method for manufacturing the cell performance according to an embodiment of the present invention.

FIG. 5 is a cross-sectional view illustrating a second unit cell applied to the method for manufacturing the cell performance according to an embodiment of the present invention, and FIG. 6 is a plan view illustrating the second unit cell applied to the method for manufacturing the cell performance according to an embodiment of the present invention.

Hereinafter, the method for manufacturing the cell performance according to an embodiment of the present invention will be described in more detail with reference to FIGS. 1 to 10.

Referring to FIGS. 3 and 4, the method for measuring the cell performance according to an embodiment of the present invention is a method for measuring performance of a unit cell 110 in which the first electrode 111 comprising a first electrode tab 115, the separator 114, and the second electrode 112 comprising a second electrode tab 116 are alternately laminated to be bonded to each other.

In the additional lamination step, counter electrodes 121 which have the same polarity as that of the second electrode 112 at sides opposite to the first electrode 111 on the outermost sides of the unit cell 110 and each of which is provided with a third electrode tab 122 may be laminated with the separator 114 therebetween. Here, for example, the first electrode tab 115 and the second electrode tab 116 may extend in one direction of the unit cell 110, and the third electrode tab 122 may extend in the other direction of the unit cell 110.

Furthermore, in the additional lamination step, for example, the counter electrodes 121 may be laminated on the outside of the first electrode 111 in a non-bonding manner. Also, in the additional lamination step, for another example, the counter electrodes 121 may be laminated on the outside of the first electrode 111 so as to be laminated in a bonding manner.

The unit cell 110 may be provided as, for example, a bi-cell in which the second electrode 112 is disposed at a central side, and the first electrode 111 is disposed at each of both sides with respect to the second electrode 112.

Here, referring to FIGS. 3 and 4, the bi-cell may be provided in plurality. At least one bi-cell of the plurality of bi-cells may be provided as a first bi-cell (unit cell) in which the first electrode 111 is provided as a negative electrode, and the second electrode 112 is provided as a positive electrode. Referring to FIGS. 5 and 6, at least the other bi-cell may be provided as a second bi-cell (unit cell) in which the first electrode 211 is provided as a positive electrode, and the second electrode 212 is provided as a negative electrode. Here, referring to FIGS. 3 to 6, in the second bi-cell 210, like the first bi-cell 110, the first electrode tab 215 may be disposed on the first electrode 211, the second electrode tab 216 may be disposed on the second electrode 212, and the third electrode tab 222 may be disposed on the counter electrode 221. Thus, each of the first electrode tab 215, the second electrode tab 216, and the third electrode tab 222 may be electrically connected to a measurement unit. Here, the separator 214 may insulate the first electrode 211, the second electrode 212, and the counter electrode 221 from each other.

Figure 7:
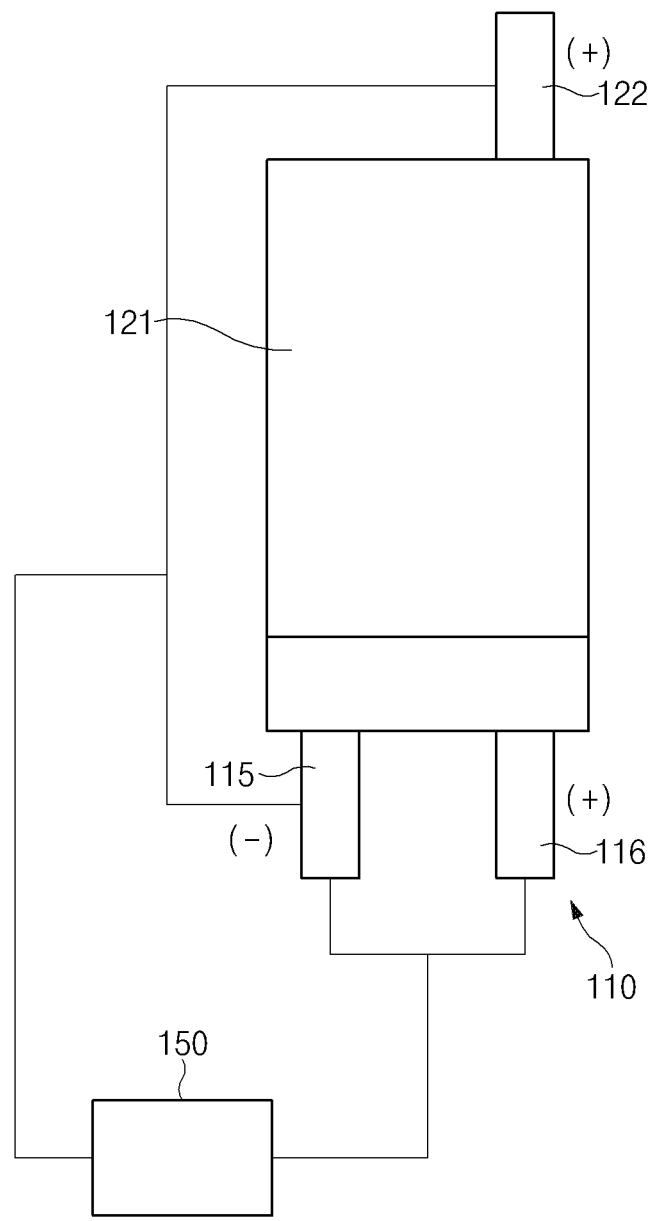
FIG. 7 is a plan view illustrating a concept of measuring performance of the first unit cell in an outer interface analysis step and an inner interface analysis step in the method for manufacturing the cell performance according to an embodiment of the present invention.
Figure 8:
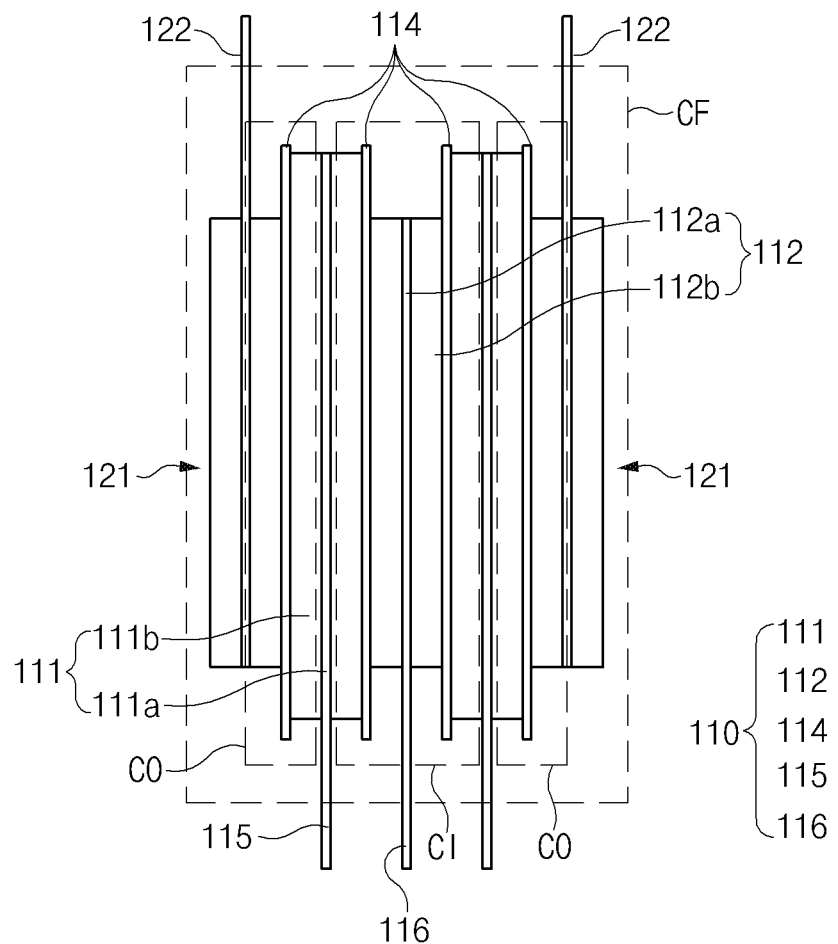
FIG. 8 is a cross-sectional view illustrating a measurement region of the first unit cell in the outer interface analysis step and the inner interface analysis step in the method for manufacturing the cell performance according to an embodiment of the present invention.

FIG. 7 is a plan view illustrating a concept of measuring performance of the first unit cell in the outer interface analysis step and the inner interface analysis step in the method for manufacturing the cell performance according to an embodiment of the present invention, and FIG. 8 is a cross-sectional view illustrating a measurement region of the first unit cell in the outer interface analysis step and the inner interface analysis step in the method for manufacturing the cell performance according to an embodiment of the present invention.

Figure 9:
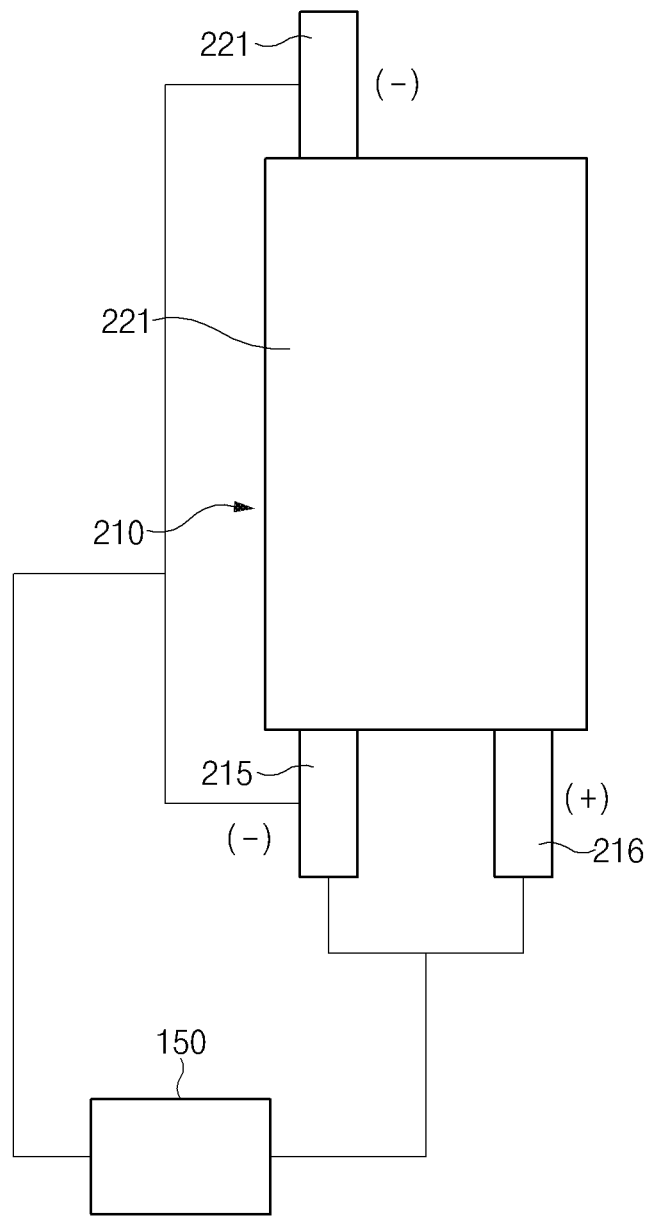
FIG. 9 is a plan view illustrating a concept of measuring performance of the second unit cell in the outer interface analysis step and the inner interface analysis step in the method for manufacturing the cell performance according to an embodiment of the present invention.

FIG. 9 is a plan view illustrating a concept of measuring performance of the second unit cell in the outer interface analysis step and the inner interface analysis step in the method for manufacturing the cell performance according to an embodiment of the present invention, and FIG. is a cross-sectional view illustrating a measurement region of the second unit cell in the outer interface analysis step and the inner interface analysis step in the method for manufacturing the cell performance according to an embodiment of the present invention.

Referring to FIGS. 3, 4, 7, and 8, in the outer interface analysis step, performance of an outer region CO of the unit cell 110 may be analyzed. That is, a difference in performance between interfaces of the first electrode 111, which is disposed at the outermost side in the unit cell 110, and the counter electrode 121 may be measured. Here, in the outer interface analysis step, the first electrode tab 115 disposed on the first electrode 111 and the third electrode tab 122 disposed on the counter electrode 121 may be electrically connected to each other to measure a difference in performance between the interfaces of the first electrode 111 and the counter electrode 121. Here, in the outer interface analysis step, after the unit cell 110 is immersed in an electrolyte, a difference in performance between the interfaces of the first electrode 111, which is disposed at the outermost side in the unit cell 110, and the counter electrode 121 may be measured.

Also, in the outer interface analysis step, the measurement unit 150 (measurement unit brand name: PNE, voltage value: 0-5V/8A, and error range: ±0.1%) may measure a difference in performance between the interfaces by measuring a resistance value or a current value. Here, in the outer interface analysis step, the more the resistance value decreases, or the current value increases, the more the performance between the interfaces is improved. Here, the measurement unit 150 may comprises a resistance measurement part (not shown) for measuring a resistance value, a voltage measurement part (not shown) for measuring a voltage value, and a capacity measurement part for measuring a battery capacity.

In the outer interface analysis step, each of outer interfaces of the plurality of unit cells 110 may be analyzed to compare and analyze cell performance between the outer interfaces. Here, in the outer interface analysis step, for example, cell performance between the interfaces when the first electrode 111 and the counter electrode 121 are bonded to each other and when the interfaces when the first electrode 111 and the counter electrode 121 are not bonded to each other may be measured to analyze a difference in performance between the interfaces when the counter electrode 121 is bonded and is not bonded to the first electrode 111. Also, referring to FIGS. 3 and 5, in the outer interface analysis step, for example, each of outer interfaces of the first bi-cell 110 and the second bi-cell 210 may be analyzed to analyze cell performance between the first bi-cell 110 and the second bi-cell 210.

Referring to FIGS. 7 and 8, in the inner interface analysis step, performance of an inner region CI of the unit cell may be analyzed. That is, a difference in performance between interfaces of the second electrode 112, which is disposed at the central position of the unit cell 110, and the first electrode 111, which is disposed at the outermost side, may be measured. Here, in the inner interface analysis step, the second electrode tab 116 disposed on the second electrode 112 and the first electrode tab 115 disposed on the first electrode 111 may be electrically connected to each other to measure a difference in performance between the interfaces of the first electrode 111 and the second electrode 112. Here, in the outer inner interface analysis step, after the unit cell 110 is immersed in the electrolyte, a difference in performance between the interfaces of the second electrode 112, which is disposed at the central position of the unit cell 110, and the first electrode 110, which is disposed at outermost side, may be measured.

Also, in the inner interface analysis step, the measurement unit 150 may measure the resistance value or the current value to measure a difference in performance between the interfaces. Here, in the inner interface analysis step, as the resistance value decreases, or the current value increases, it may be determined that the performance between the interfaces is improved.

Referring to FIGS. 7 to 10, in the outer interface analysis step and the inner interface analysis step, each of the difference in performance between the interfaces of the first bi-cell 110 and the difference in performance between the interfaces of the second bi-cell 210 may be measured to analyze a difference in cell performance between the first bi-cell 110 and the second bi-cell 210. That is, in the outer interface analysis step and the inner interface analysis step, cell performance in the outer region CO and the inner region CI of the first bi-cell 110 and cell performance in an outer region AO and an inner region AI of the first bi-cell 210 may be compared and analyzed with each other.

The outer interface analysis step and the inner interface analysis step may be performed at the same time to analyze performance of entire regions CF and AF of the first bi-cell 110 and the second bi-cell 210. That is, the outer interface analysis step and the inner interface analysis step may be performed at the same time to measure the total resistance value and current value of the first bi-cell 110 and the total resistance value and current value of the second bi-cell 210, thereby comparing the resistance values and the current values of the first bi-cell 110 and the second bi-cell 210 to each other so as to analyze a difference in cell performance. That is, in the first bi-cell 110 and the second bi-cell 210, the first electrode tabs 115 and 215 disposed on the first electrodes 111 and 211 and the third electrode tabs 122 and 222 disposed on the counter electrodes 121 may be electrically connected to each other, and the second electrode tabs 116 and 216 disposed on the second electrodes 112 and 212 and the first electrode tabs 115 and 215 disposed on the first electrodes 111 and 211 may be electrically connected to each other to measure each of differences in performance between the entire interfaces of the first bi-cell 110 and the second bi-cell 210, thereby comparing and analyzing the differences in performance therebetween. Here, a charging and discharging curve is represented through the total measured resistance values and the total measured current values of the first bi-cell 110 and the second bi-cell 210, and characteristics of the charging and discharging curve may be confirmed to determine the cell performance. Also, a current-voltage curve or an internal resistance value may be confirmed through the total measured resistance values and the total measured current values. For example, direct current internal resistance (DCIR) and hybrid pulse power characterization (HPPC) may be confirmed by using the current-voltage curve.

Hereinafter, a method for manufacturing cell performance according to another embodiment of the present invention will be described.

Figure 11:
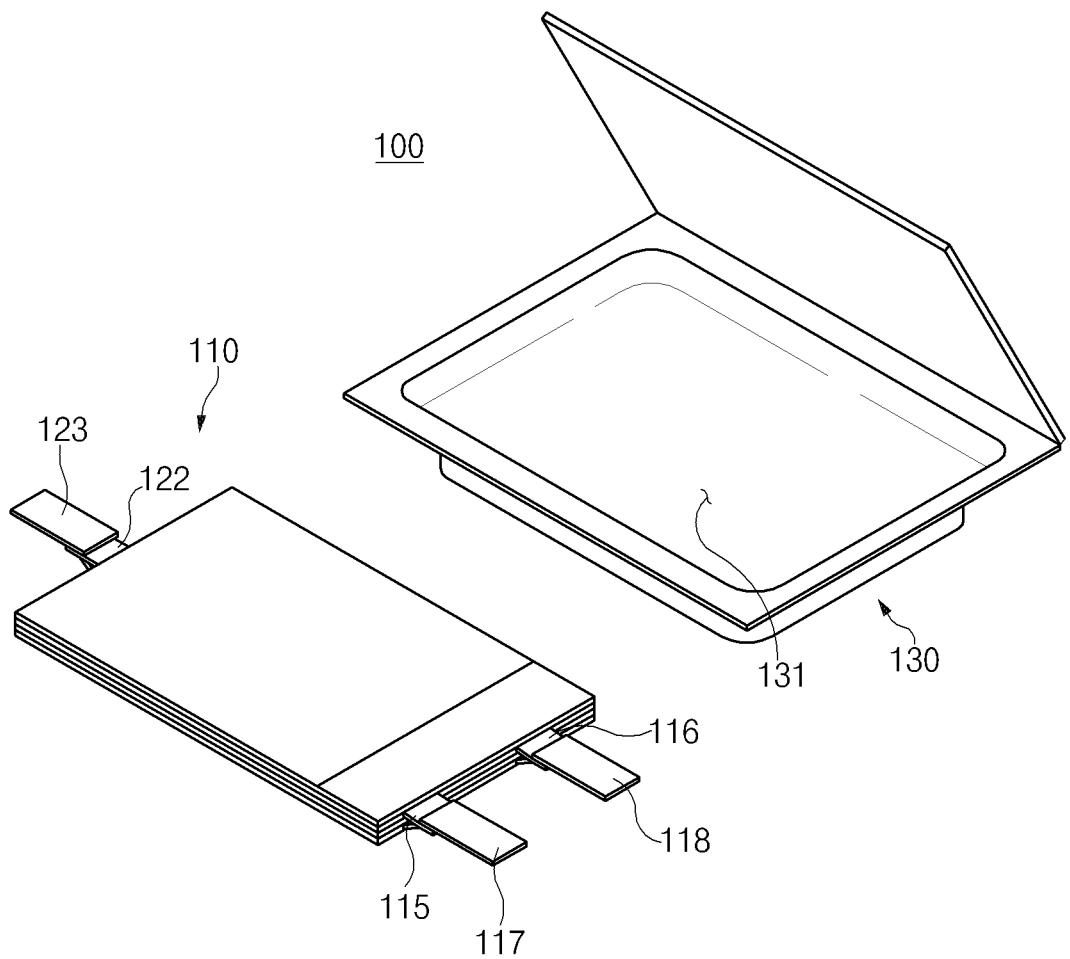
FIG. 11 is a perspective view illustrating an accommodation step of accommodating a first unit cell in a method for manufacturing cell performance according to another embodiment of the present invention.
Figure 12:
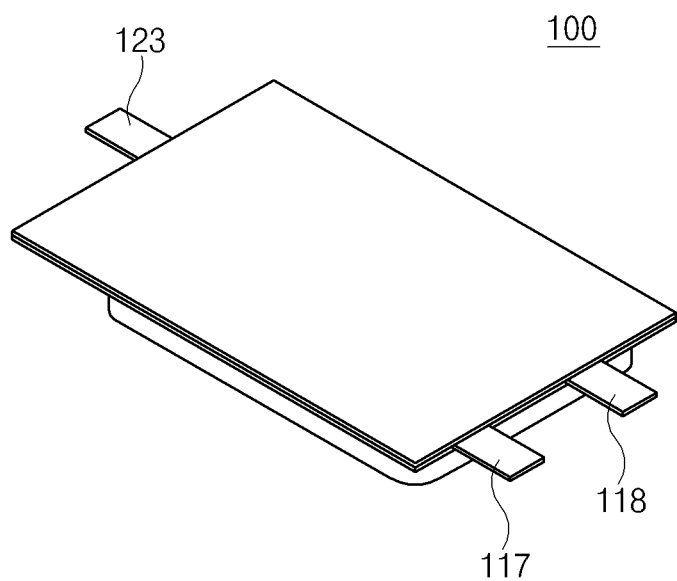
FIG. 12 is a perspective view illustrating a state in which the first unit cell is accommodated in the method for manufacturing the cell performance according to another embodiment of the present invention.
Figure 13:
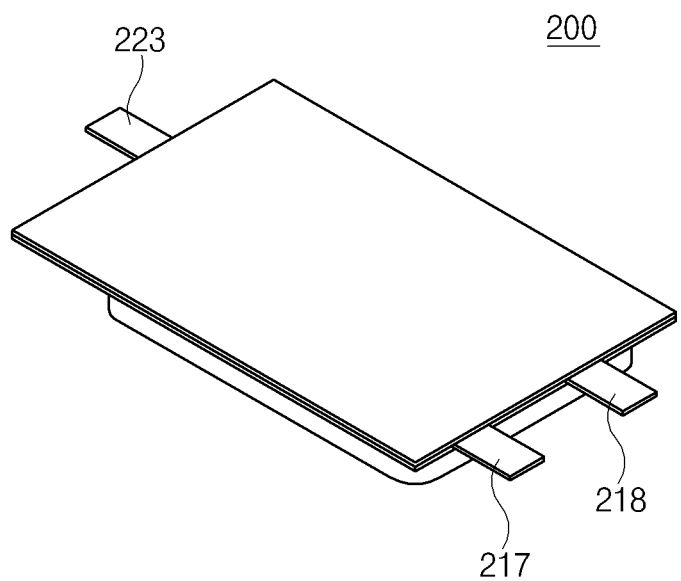
FIG. 13 is a perspective view illustrating a state in which a second unit cell is accommodated in the method for manufacturing the cell performance according to another embodiment of the present invention.

FIG. 11 is a perspective view illustrating an accommodation step of accommodating a first unit cell in a method for manufacturing cell performance according to another embodiment of the present invention, FIG. 12 is a perspective view illustrating a state in which the first unit cell is accommodated in the method for manufacturing the cell performance according to another embodiment of the present invention, and FIG. 13 is a perspective view illustrating a state in which a second unit cell is accommodated in the method for manufacturing the cell performance according to another embodiment of the present invention.

Referring to FIGS. 3 and 11, a method for measuring performance of a unit cell 110 in which a first electrode 111 provided with a first electrode tab 115, a separator 114, and a second electrode 112 provided with a second electrode tab 116 are alternately laminated to be bonded to each other comprises an additional lamination step of further laminating a counter electrode 121 provided with a third electrode tab 122 at the outermost side of the unit cell 110, an outer interface analysis step of measuring a difference in performance between interfaces of the first electrode 111 and the counter electrode 121, an inner interface analysis step of measuring a difference in performance between the first electrode 111 and the second electrode 112, and an accommodation step of accommodating the unit cell 110 together with an electrolyte in an accommodation part 131 of a battery case 130 to seal the battery case 130. (see FIG. 3)

The method for measuring the cell performance according to another embodiment of the present invention is different from the method for measuring the cell performance according to the foregoing embodiment of the present invention in that the accommodation step of accommodating the unit cell 110 together with the electrolyte in the battery case 130 is further performed. Thus, contents of this embodiment, which are duplicated with those according to the foregoing embodiment, will be briefly described, and also, differences therebetween will be mainly described.

In more detail, in the method for measuring the cell performance according to another embodiment of the present invention, in the additional lamination step, the counter electrodes 121 which have the same polarity as that of the second electrode 112 at sides opposite to the first electrode 111 on the outermost sides of the unit cell 110 and each of which is provided with a third electrode tab 122 may be laminated with the separator 114 therebetween.

Here, for example, the first electrode tab 115 and the second electrode tab 116 may extend in one direction of the unit cell 110, and the third electrode tab 122 may extend in the other direction of the unit cell 110.

The unit cell 110 may be provided as, for example, a bi-cell in which the second electrode 112 is disposed at a central side, and the first electrode 111 is disposed at each of both sides with respect to the second electrode 112.

In addition, in the additional lamination step, the counter electrode 121 may be laminated on each of both the outermost sides of the bi-cell.

Furthermore, in the additional lamination step, for example, the counter electrodes 121 may be laminated on the outside of the first electrode 111 in a non-bonding manner.

Also, in the additional lamination step, for another example, the counter electrodes 121 may be laminated on the outside of the first electrode 111 so as to be laminated in a bonding manner.

The bi-cell may be provided in plurality. At least one bi-cell of the plurality of bi-cells may be provided as a first bi-cell in which the first electrode 111 is provided as a negative electrode, and the second electrode 112 is provided as a positive electrode, and at least the other bi-cell may be provided as a second bi-cell in which the first electrode 111 is provided as a positive electrode, and the second electrode 112 is provided as a negative electrode. (see FIG. 5)

Referring to FIGS. 2 and 11 to 13, in the accommodation step, the unit cell 110 may be accommodated together with the electrolyte in the battery case 130 after the additional lamination step is performed.

Also, in the method for manufacturing the cell performance according to another embodiment of the present invention, the accommodation step may further comprise a lead connection step of connecting a first electrode lead 117 to the first electrode tab 115, connecting a second electrode lead 118 to the second electrode tab 116, and connecting a third electrode lead 123 to the third electrode tab 122.

Ends of the first electrode lead 117, the second electrode lead 118, and the third electrode lead 123 may protrude to the outside of the battery case 130. Here, the first electrode lead 117, the second electrode lead 118, and the third electrode lead 123 may be electrically connected to a measurement unit 150. Thus, the measurement unit 150 may be electrically connected to the first electrode tab 115 through the first electrode lead 117, be connected to the second electrode tab 116 through the second electrode lead 118, and be connected to the third electrode tab 122 through the third electrode lead 123. (see FIG. 7).

Here, the first bi-cell 110 may be accommodated together with the electrolyte in the battery case 130 to form a first secondary battery 100, and the second bi-cell 210 may be accommodated together with the electrolyte in the battery case 130 to form a second secondary battery 200. (see FIG. 5) Thereafter, when measuring performance of the first bi-cell (unit cell) 110 and the second bi-cell (unit cell) 210, performance of the first secondary battery 100 and the second secondary battery 200 may be measured.

Referring to FIG. 8, in the inner interface analysis step, the second electrode tab 116 disposed on the second electrode 112 and the first electrode tab 115 disposed on the first electrode 111 may be electrically connected to each other to measure a difference in performance between the interfaces of the first electrode 111 and the second electrode 112. Here, in the inner interface analysis step, the first electrode tab 115 and the second electrode tab 116 may be electrically connected to the measurement unit 150 through the first electrode lead 117 and the second electrode lead 118. (see FIG. 7)

In the outer interface analysis step, the first electrode tab 115 disposed on the first electrode 111 and the third electrode tab 122 disposed on the counter electrode 121 may be electrically connected to each other to measure a difference in performance between the interfaces of the first electrode 111 and the counter electrode 121. Here, in the outer interface analysis step, the first electrode tab 115 and the third electrode tab 122 may be electrically connected to the measurement unit 150 through the first electrode lead 117 and the third electrode lead 123. (see FIG. 7)

Figure 10:
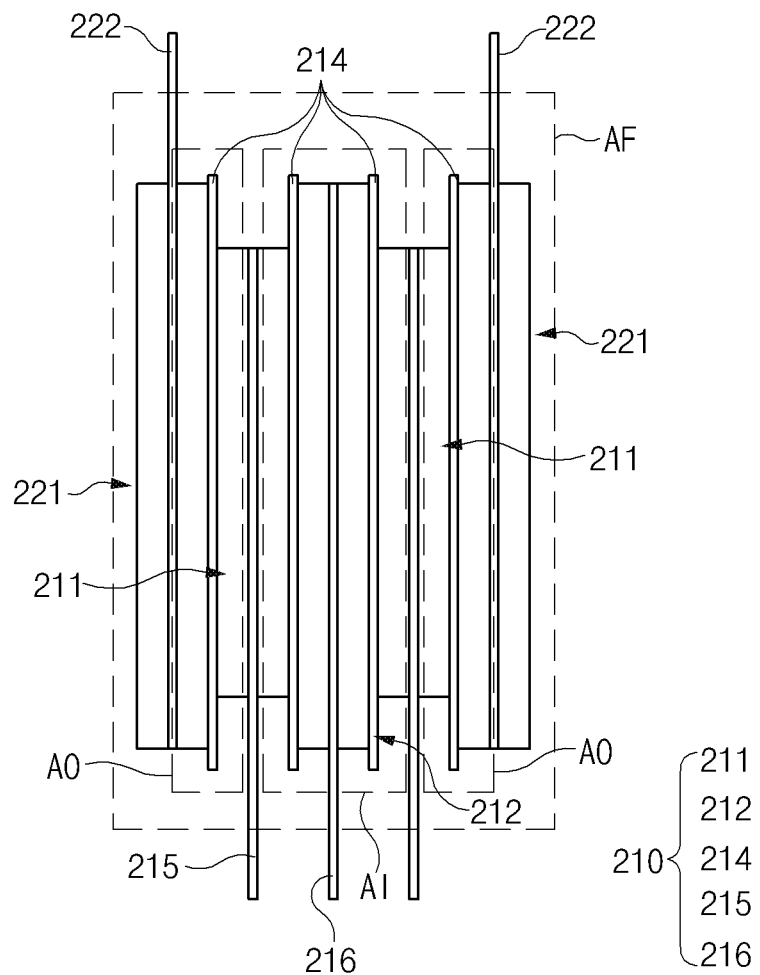
FIG. 10 is a cross-sectional view illustrating a measurement region of the second unit cell in the outer interface analysis step and the inner interface analysis step in the method for manufacturing the cell performance according to an embodiment of the present invention.

Referring to FIGS. 8 to 10, in the outer interface analysis step and the inner interface analysis step, each of the difference in performance between the interfaces of the first bi-cell 110 and the difference in performance between the interfaces of the second bi-cell 210 may be measured to analyze a difference in cell performance between the first bi-cell 110 and the second bi-cell 210. (see FIG. 5)

Experimental Example 1

Figure 14:
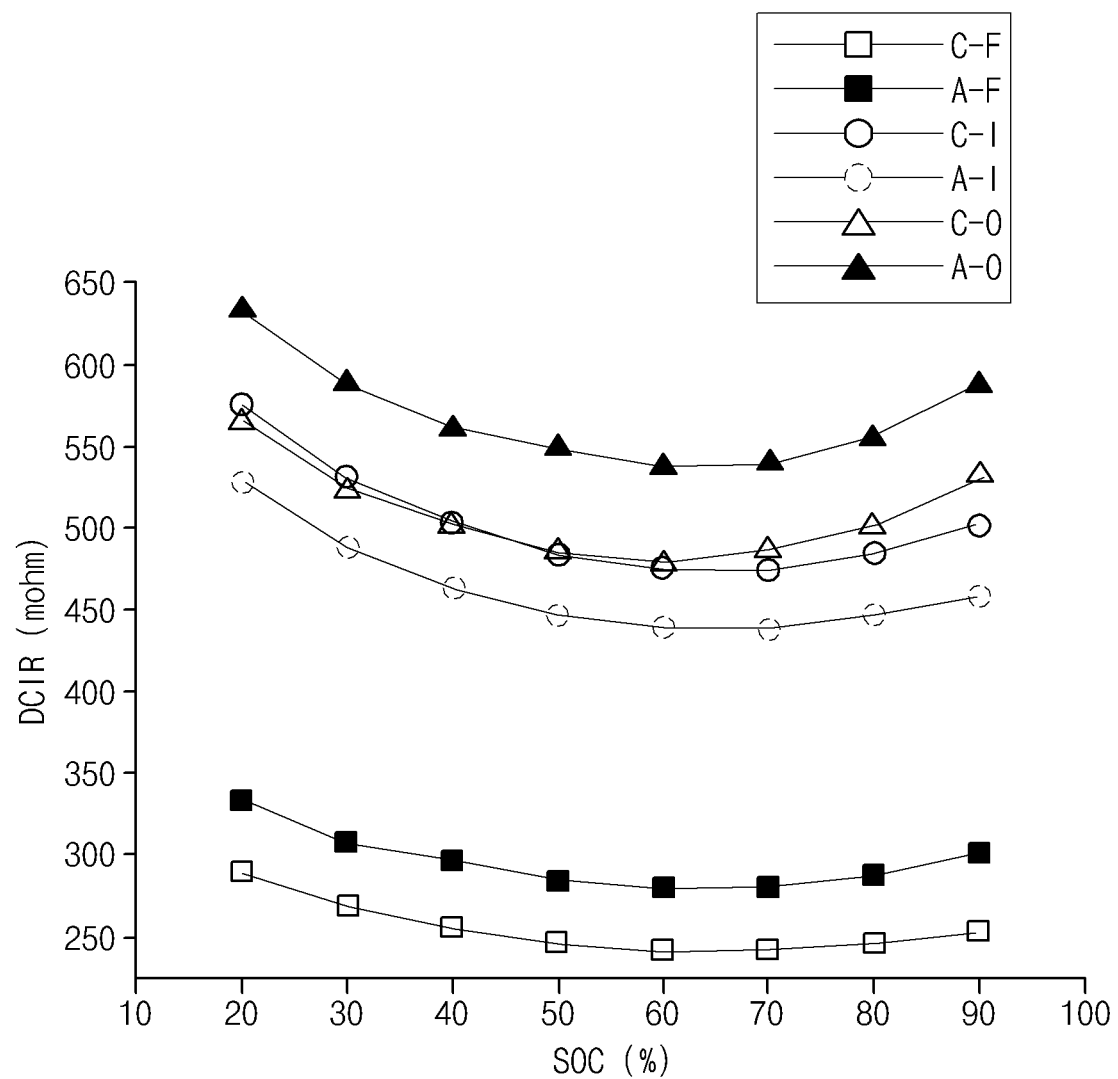
FIG. 14 is a graph illustrating results obtained by measuring performance of a first bi-cell and a second bi-cell through the method for manufacturing the cell performance according to an embodiment of the present invention.

FIG. 14 is a graph illustrating results obtained by measuring performance of a first bi-cell and a second bi-cell through the method for manufacturing the cell performance according to an embodiment of the present invention.

Referring to FIG. 14, each of the differences in performance between outer interfaces, inner interfaces, and entire interfaces of the first and second bi-cells was measured. In the graph of FIG. 14, a vertical axis represents direct current internal resistance (DCIP), and a horizontal axis represents a state of charge (SOC). Here, a counter electrodes was laminated at each of the outermost sides of the first bi-cell and the second bi-cell. Also, a value obtained by measuring each DC resistance by electrically connecting the first electrode tab, the second electrode tab, and the third electrode tab of the first bi-cell and the second bi-cell to a resistance measurement unit (measurement unit brand name: PNE, voltage value: 0-5V/8A, and error range: ±0.1%) was shown in a graph.

In the graph shown in FIG. 14, it is seen that an outer interface resistance value C-O of the first bi-cell is less than an outer interface resistance value A-O of the second bi-cell, an inner interface resistance value C-I of the first bi-cell is greater than an inner interface resistance value A-I of the second bi-cell, and a total resistance value C-F of the first bi-cell is less than a total resistance value A-F of the second bi-cell.

Thus, it is seen that the cell performance of the first bi-cell is better than the cell performance of the second bi-cell in FIG. 14 because the total resistance value C-F of the first bi-cell is less than the total resistance value A-F of the second bi-cell even though the outer interface resistance value C-O of the first bi-cell is less than the outer interface resistance value A-O of the second bi-cell, and the inner interface resistance value C-I of the first bi-cell is greater than the inner interface resistance value A-I of the second bi-cell.

The performance of the unit cells having the various shapes may be more easily determined through the above-described method for measuring the cell performance.

Experimental Example 2

Figure 15:
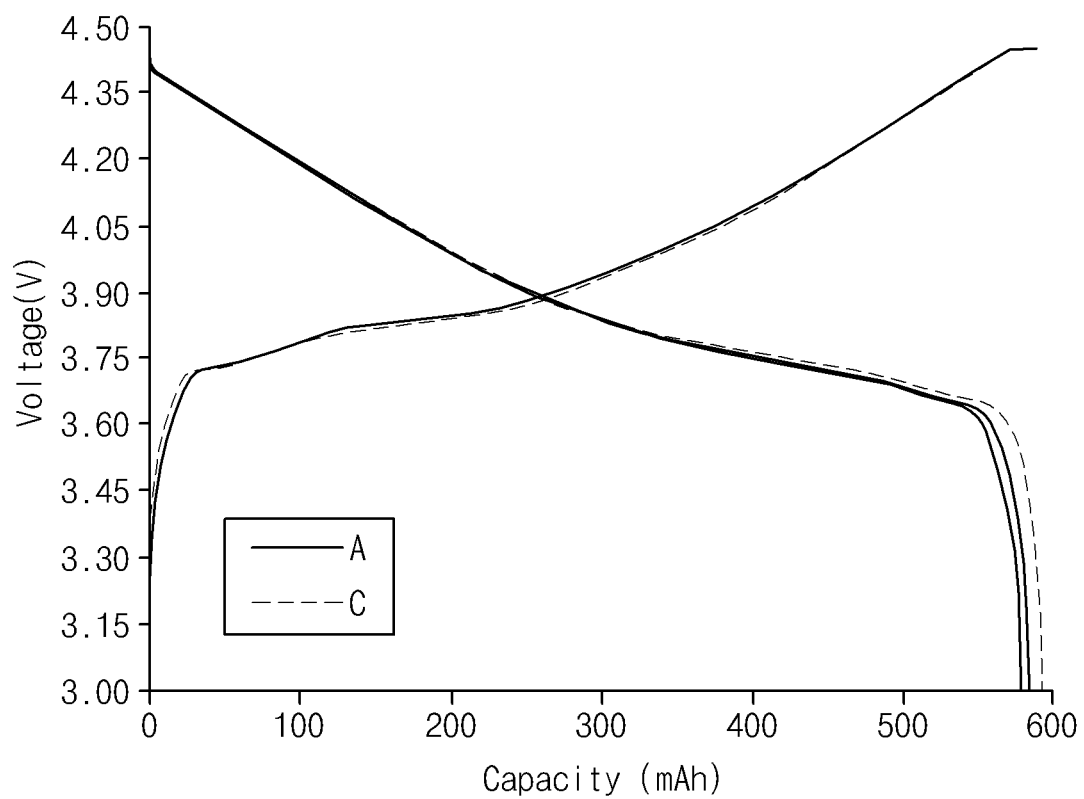
FIG. 15 is a graph illustrating results obtained by measuring charging and discharging performance of the first bi-cell and the second bi-cell through the method for manufacturing the cell performance according to an embodiment of the present invention.

FIG. 15 is a graph illustrating results obtained by measuring charging and discharging performance of the first bi-cell and the second bi-cell through the method for manufacturing the cell performance according to an embodiment of the present invention.

Referring to FIG. 15, each of differences in performance between entire interfaces comprising outer interfaces and inner interfaces of the first and second bi-cells was measured. In the graph of FIG. 15, a vertical axis represents a voltage V, and a horizontal axis represents a charge and discharge capacity (mAh). Here, a counter electrodes was laminated at each of the outermost sides of the first bi-cell and the second bi-cell. Also, a value obtained by measuring each of the total resistance value and the total current value by electrically connecting the first electrode tab, the second electrode tab, and the third electrode tab of the first bi-cell and the second bi-cell to a resistance and current measurement unit (measurement unit brand name: PNE, voltage value: 0-5V/8A, and error range: ±0.1%) was shown in a charging and discharging curve. That is, the resistance value and the current value were measured to extract a voltage value and a capacitance value. Here, the voltage value was obtained through the formula V (voltage value)=I (current value)*R (resistance value), and the capacitance value was obtained by multiplying the current value I by a time t. In addition, the measurements were performed under conditions of 10% SOC and 25° C.

It is seen that, as the discharge proceeds in the downward discharge graph shown in FIG. 15, a voltage value C of the entire interface of the first bi-cell is greater than a voltage value A of the total interface of the second bi-cell. In addition, it is seen that the discharge capacity of the entire interface of the first bi-cell is larger than the discharge capacity of the second bi-cell. Therefore, it is seen that the charge and discharge performance of the entire interface of the first bi-cell is better than the charge and discharge performance of the entire interface of the second bi-cell.

The performance of the unit cells having the various shapes may be more easily determined through the above-described method for measuring the cell performance.

While the present invention has been particularly shown and described with reference to exemplary embodiments thereof, it is to be understood that the scope of the present invention is not limited to the method for manufacturing the cell performance according to the present invention. It will be understood by those of ordinary skill in the art that various changes in form and details may be made therein without departing from the spirit and scope of the invention.

Furthermore, the scope of protection of the present invention will be clarified by the appended claims.

The invention claimed is:

1. A method for measuring performance of a unit cell, the method comprising:
   alternately laminating a first electrode provided with a first electrode tab, a separator, and a second electrode provided with a second electrode tab to be bonded to each other;
   an additional lamination step of further laminating counter electrodes, each counter electrode having a same polarity as a polarity of the second electrode and provided with a third electrode tab, on sides facing the first electrode at outermost sides of the unit cell with the separator therebetween; and
   an outer interface analysis step of measuring a difference in performance between the first electrode and one of the counter electrodes by electrically connecting the first electrode tab disposed on the first electrode to the third electrode tab disposed on one of the counter electrodes.

2. The method of claim 1, further comprising an inner interface analysis step of measuring a difference in performance between interfaces of the first electrode and the second electrode by electrically connecting the second electrode tab disposed on the second electrode to the first electrode tab disposed on the first electrode.

3. The method of claim 2, wherein the first electrode tab and the second electrode tab extend in a first direction of the unit cell, and the third electrode tab extends in a second direction of the unit cell.

4. The method of claim 2, further comprising, after performing the additional lamination step, an accommodation step of accommodating the unit cell together with an electrolyte in a battery case.

5. The method of claim 4, wherein the accommodation step further comprises a lead connection step of connecting a first electrode lead to the first electrode tab, connecting a second electrode lead to the second electrode tab, and connecting a third electrode lead to the third electrode tab.

6. The method of claim 2, wherein the unit cell is provided as a bi-cell in which the second electrode is disposed at a central location, and the first electrode is disposed at each of opposite sides of the second electrode.

7. The method of claim 6, wherein, in the additional lamination step, the counter electrodes are laminated on both the outermost sides of the bi-cell, respectively.

8. The method of claim 7, wherein, in the additional lamination step, each of the counter electrodes is laminated on the outside of the first electrode in a non-bonding manner.

9. The method of claim 7, wherein, in the additional lamination step, each of the counter electrodes is laminated on the outside of the first electrode in a bonding manner.

10. The method of claim 6, wherein the bi-cell is provided in plurality,
at least one bi-cell of the plurality of bi-cells is provided as a first bi-cell in which the first electrode is provided as a negative electrode, and the second electrode is provided as a positive electrode, and
at least one other bi-cell is provided as a second bi-cell in which the first electrode is provided as a positive electrode, and the second electrode is provided as a negative electrode.

11. The method of claim 10, wherein, in the outer interface analysis step and the inner interface analysis step, each of a difference in performance between interfaces of the first bi-cell and a difference in performance between interfaces of the second bi-cell is measured to analyze a difference in cell performance between the first bi-cell and the second bi-cell.

12. A method for measuring performance of a secondary battery comprising a unit cell, the method comprising:
alternately laminating a first electrode provided with a first electrode tab, a separator, and a second electrode provided with a second electrode tab to be bonded to each other;
accommodating the unit cell in a battery case;
an additional lamination step of further laminating counter electrodes, each of which has a same polarity as a plurality of the second electrode and is provided with a third electrode tab, on sides facing the first electrode at outermost sides of the unit cell with the separator therebetween; and
an outer interface analysis step of measuring a difference in performance between the first electrode and each of the counter electrodes by electrically connecting the first electrode tab disposed on the first electrode to one of the third electrode tabs disposed on one of the counter electrodes.

* * * * *